(12) United States Patent
Wei et al.

(10) Patent No.: US 11,291,137 B2
(45) Date of Patent: Mar. 29, 2022

(54) COOLING DEVICE

(71) Applicant: HONGFUJIN PRECISION ELECTRONICS(TIANJIN)CO., LTD., Tianjin (CN)

(72) Inventors: Chao-Ke Wei, New Taipei (TW); Hui-Hsuan Wang, Neihu (TW); Ching-Tang Liu, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 390 days.

(21) Appl. No.: 16/585,537

(22) Filed: Sep. 27, 2019

(65) Prior Publication Data
US 2021/0029849 A1    Jan. 28, 2021

(30) Foreign Application Priority Data
Jul. 24, 2019    (CN) .......................... 201910673717.5

(51) Int. Cl.
*H05K 7/20*    (2006.01)
(52) U.S. Cl.
CPC ..... *H05K 7/20272* (2013.01); *H05K 7/20145* (2013.01); *H05K 7/20172* (2013.01)
(58) Field of Classification Search
CPC .......... H05K 7/20272; H05K 7/20145; H05K 7/20172; H05K 7/20236; H05K 7/20781; H05K 7/20281; H05K 7/20263
See application file for complete search history.

(56) References Cited

U.S. PATENT DOCUMENTS

| | | | |
|---|---|---|---|
| 2009/0224546 A1* | 9/2009 | Davidson | C25B 1/04 290/52 |
| 2015/0029658 A1* | 1/2015 | Yairi | H05K 1/0212 361/679.47 |
| 2015/0047973 A1* | 2/2015 | Yoshida | C02F 1/46104 204/239 |

* cited by examiner

*Primary Examiner* — Emmanuel E Duke
(74) *Attorney, Agent, or Firm* — ScienBiziP, P.C.

(57) ABSTRACT

A cooling device includes a cabinet, a coolant circulation mechanism, and a heat exchange mechanism. The coolant circulation mechanism includes a first conduit, a second conduit, a control conduit, and a circulation conduit. The circulation conduit is connected to the cabinet and the heat exchange mechanism. The first conduit and the second conduit are connected to the heat exchange mechanism. The control conduit is connected to the cabinet and selectively connects to the first conduit or the second conduit. When the control conduit connects to the second conduit, coolant from the cabinet flows to the heat exchange mechanism through the second conduit. When the control conduit connects to the first conduit, coolant from the heat exchange mechanism flows to the cabinet through the first conduit. Coolant in the cabinet flows through the circulation conduit to the heat exchange mechanism when a level of the coolant reaches the circulation conduit.

20 Claims, 11 Drawing Sheets

COOLING DEVICE

FIELD

The subject matter herein generally relates to cooling devices, and more particularly to a cooling device for cooling an electronic device.

BACKGROUND

Generally, an electronic device is immersed in a coolant of a liquid-cooled cooling device. In the related art, a pipeline arrangement of the cooling device is complicated and occupies a large amount of space.

BRIEF DESCRIPTION OF THE DRAWINGS

Implementations of the present disclosure will now be described, by way of embodiments, with reference to the attached figures.

DETAILED DESCRIPTION

Figure 1:
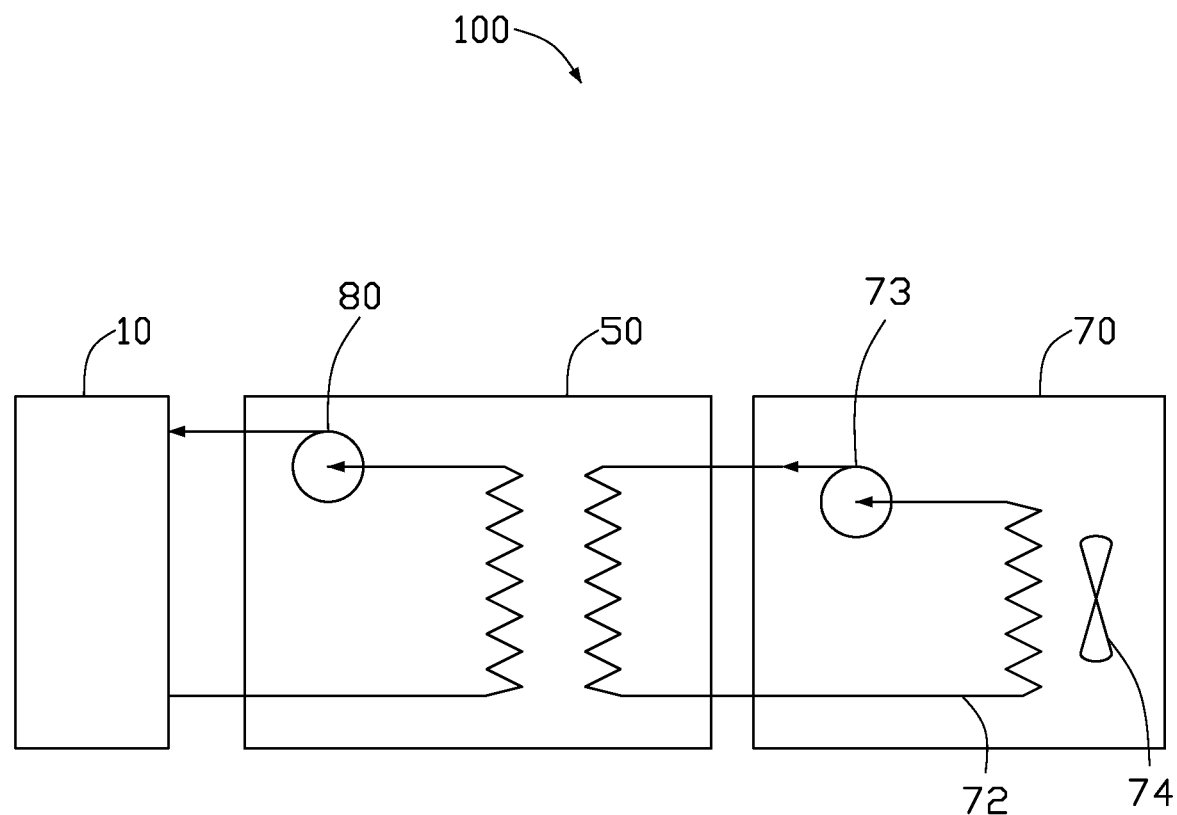
FIG. 1 is a schematic diagram of an embodiment of a cooling device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 4:
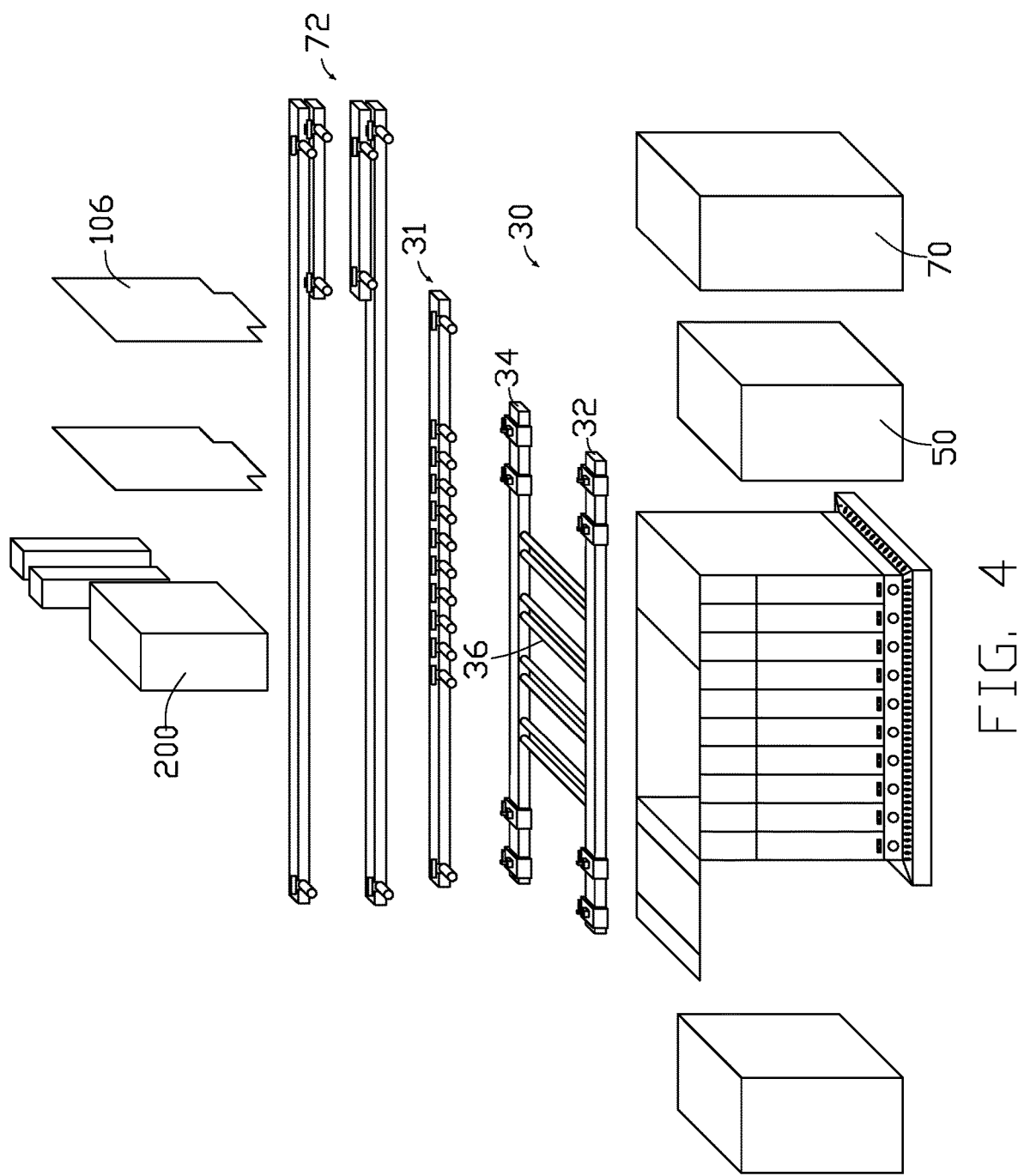
FIG. 4 is another schematic diagram of the cooling device.
Figure 9:
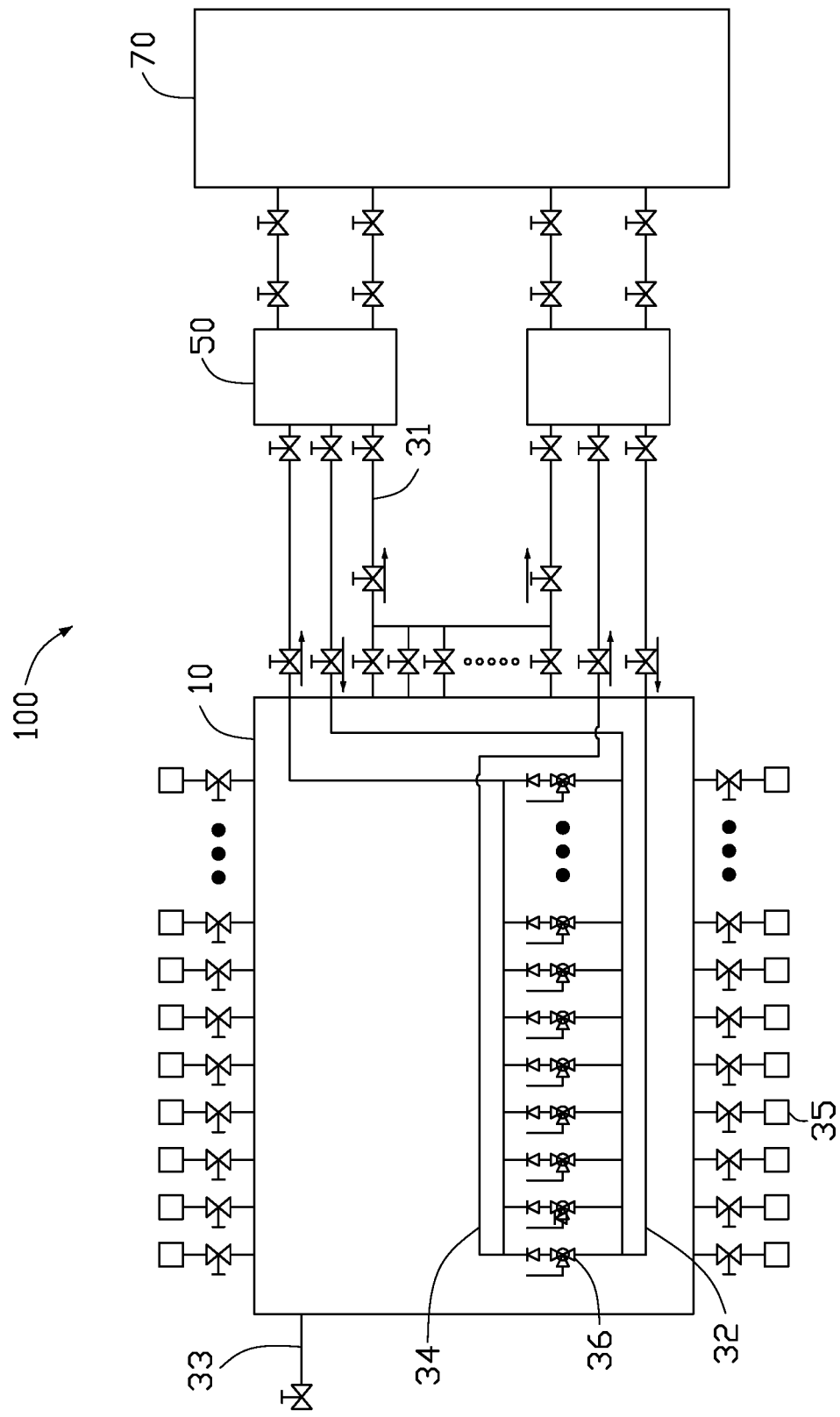
FIG. 9 is another schematic diagram of the cooling device.

FIG. 1, FIG. 4, and FIG. 9 show an embodiment of a cooling device 100 for cooling at least one electronic device 200. The electronic device 200 may be a server, a storage device, or other device that requires heat dissipation by liquid cooling. The cooling device 100 includes a cabinet 10, a coolant circulation mechanism 30, and a heat exchange mechanism 50. The cabinet 10 houses the electronic device 200. The coolant circulation mechanism 30 is connected to the heat exchange mechanism 50 and the cabinet 10 for filling a coolant in the cabinet 10 to cool the electronic device 200.

In one embodiment, the cooling device 100 further includes a cooling mechanism 70. The cooling mechanism 70 is connected to the heat exchange mechanism 50 for performing heat-exchange with the coolant. In other embodiments, the cooling mechanism 70 may be omitted.

In one embodiment, a quantity of the heat exchange mechanisms 50 is two, and the two heat exchange mechanisms 50 are respectively connected to the cabinet 10 and the cooling mechanism 70. In other embodiments, the quantity of the heat exchange mechanisms 50 may be one or more than two.

Figure 2:
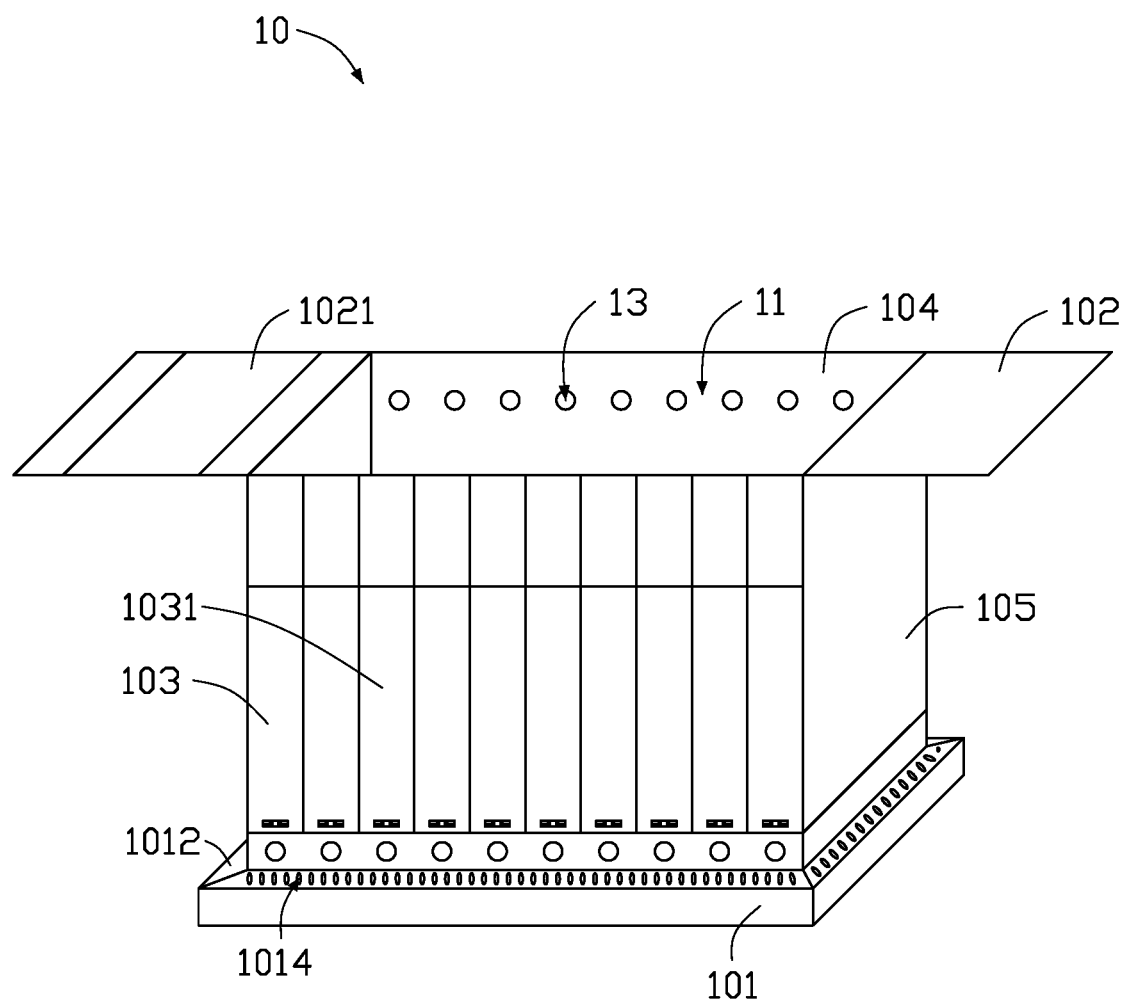
FIG. 2 is a schematic diagram of a cabinet of the cooling device.
Figure 3:
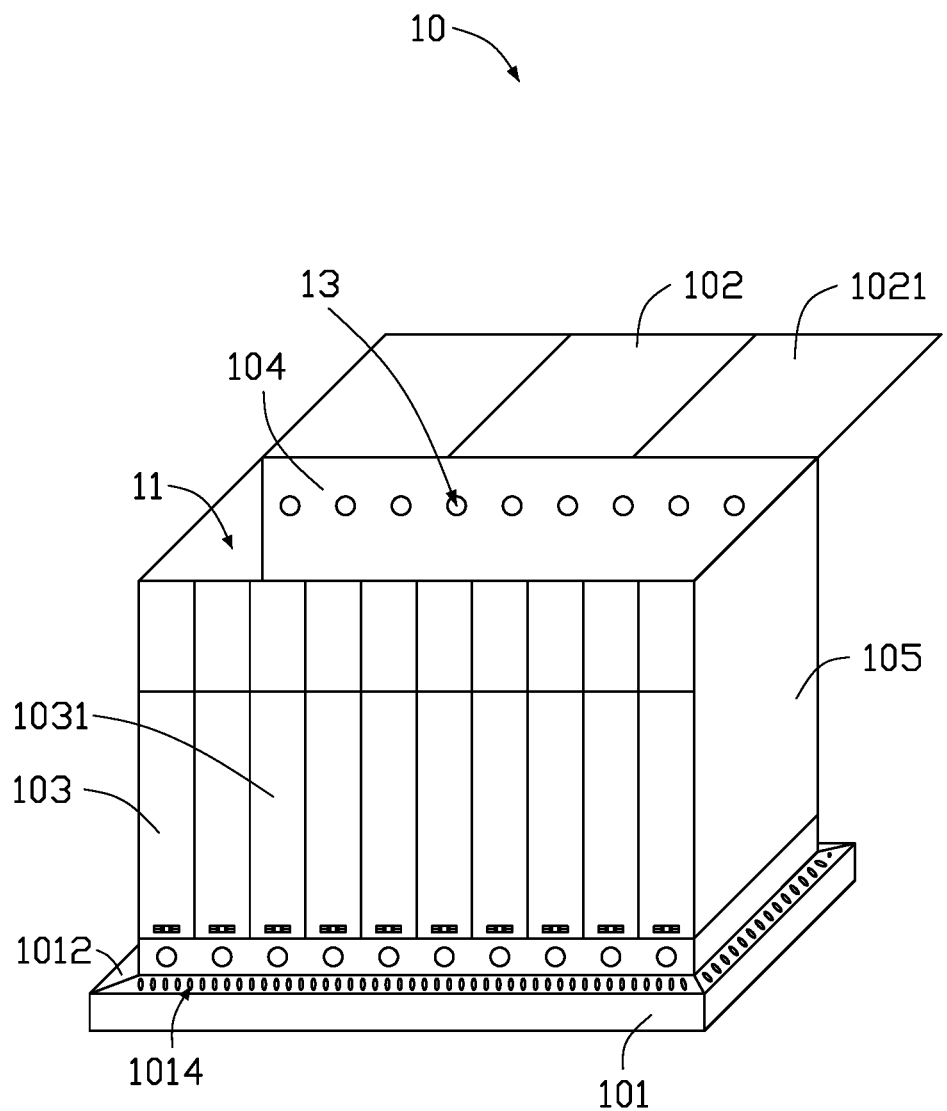
FIG. 3 is similar to FIG. 2, but showing another configuration of the cabinet.

Referring to FIGS. 2 and 3, the cabinet 10 includes a bottom plate 101, a top plate 102, a front plate 103, a rear plate 104, and two side plates 105. The bottom plate 101 is located facing the top plate 102. The front plate 103 is located facing the rear plate 104. The front plate 103 and the rear plate 104 are located between the bottom plate 101 and the top plate 102. The two side plates 105 face each other and are located between the bottom plate 101 and the top plate 102. The bottom plate 101, the top plate 102, the front plate 103, the rear plate 104, and the two side plates 105 cooperatively define a cooling chamber 11. The cooling chamber 11 receives one or more electronic devices 200, and coolant is filled in the cooling chamber 11 to cool the one or more electronic devices 200.

Referring to FIG. 4, in one embodiment, the cabinet 10 further includes at least one partition plate 106. The partition plate 106 is detachably inserted into the cooling chamber 11, and the partition plate 106 abuts the bottom plate 101, the front plate 103, and the rear plate 104 to form a watertight space. Before removing the electronic device 200, a partition plate 106 is placed on both sides (or one side) of the electronic device 200, and the coolant in the watertight space formed by the partition plates 106 is recovered to reduce use and loss of the coolant. In other embodiments, the partition plates 106 may be omitted.

In one embodiment, the front plate 103 includes a plurality of first plate segments 1031. Each of the first plate segments 1031 can be individually opened or closed to remove a corresponding electronic device 200. Thus, after the partition plates 106 are inserted, only the first plate segments 1031 corresponding to the watertight space formed by the partition plates 106 are opened to remove the electronic device 200 from the watertight space. The top plate 102 includes a plurality of second plate segments 1021. The second plate segments 1021 are capable of sliding in a horizontal plane in a first direction or a second direction perpendicular to the first direction to remove the electronic device 200.

In other embodiments, the cabinet 10 can be opened by other means, such as by pivoting the top plate 102. If the partition plates 106 are omitted, the first plate segments 1031 are omitted, such that the front plate 103 is one piece. In other embodiments, the cabinet 10 can be opened through the rear plate 104.

A plurality of cable holes 13 is defined in the rear plate 104 of the cabinet 10 adjacent to the top plate 102. The cable holes 13 are used for passing power cables, signal cables, and other cables to the electronic device 200. In other embodiments, the cable holes 13 may be defined in other portions of the cabinet 10, such as the side plates 105.

In one embodiment, the bottom plate 101 further includes four extending plates 1012. The four extending plates 1012 are located outside the front plate 103, the rear plate 104, and the two side plates 105, respectively. Each of the extending plates 1012 defines a plurality of drainage holes 1014. If the coolant in the cooling chamber 11 leaks out, the extending plates 1012 recover the leaked coolant through the drainage holes 1014. In other embodiments, the extending plates 1012 can be omitted.

Figure 5:
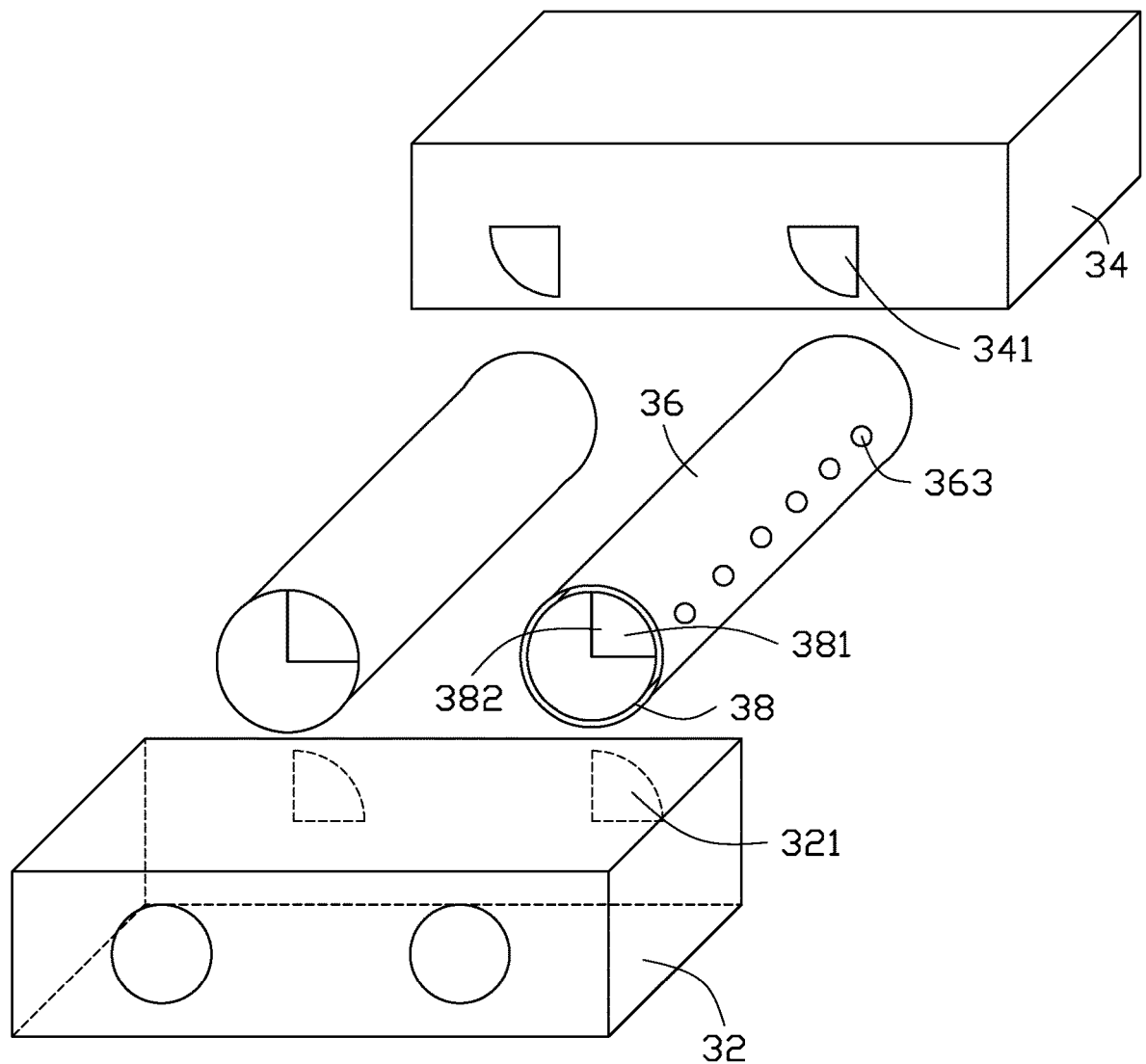
FIG. 5 is a schematic diagram of a coolant circulation mechanism.
Figure 6:
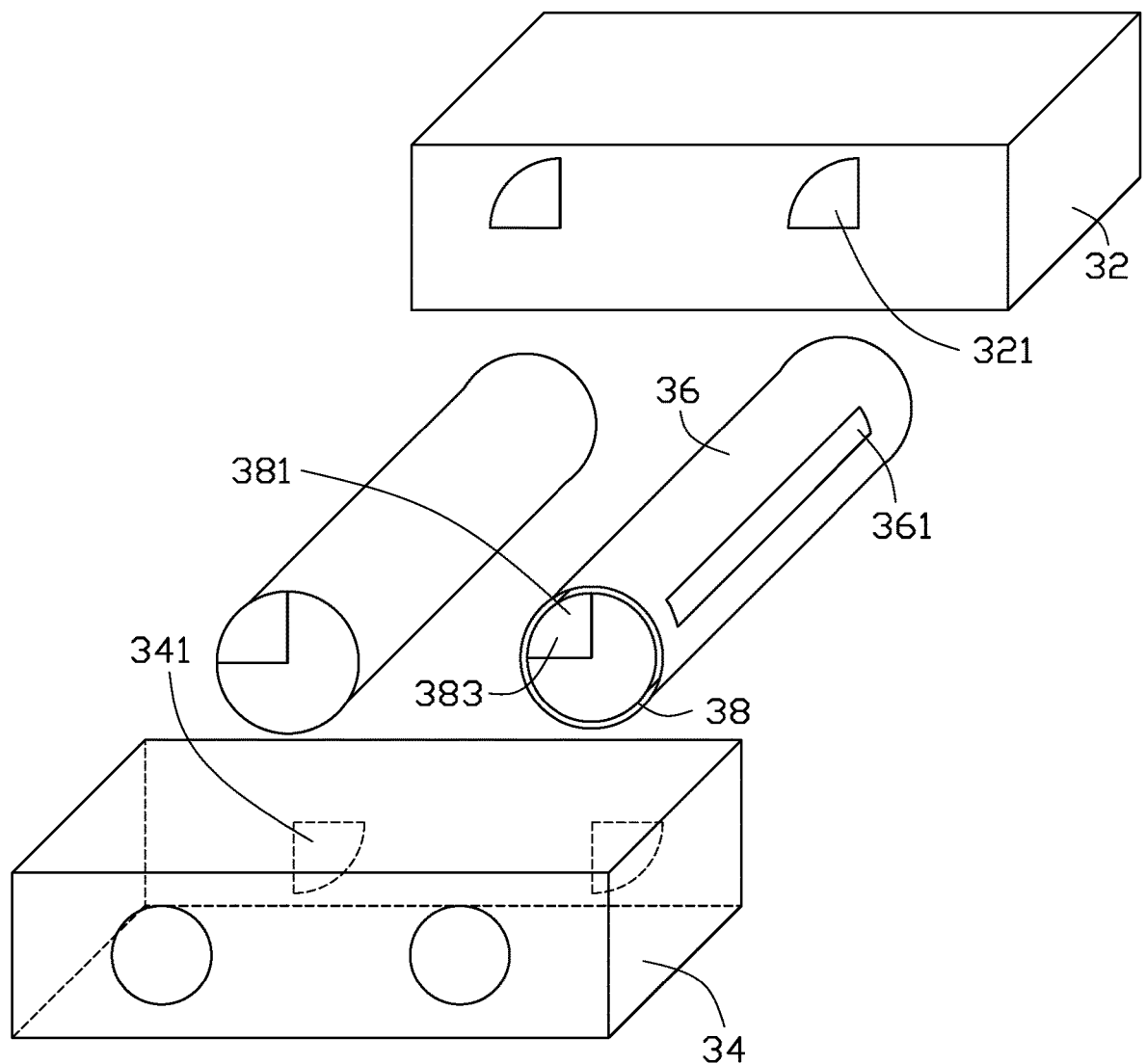
FIG. 6 is similar to FIG. 5, but showing the coolant circulation mechanism from another angle.
Figure 7A:
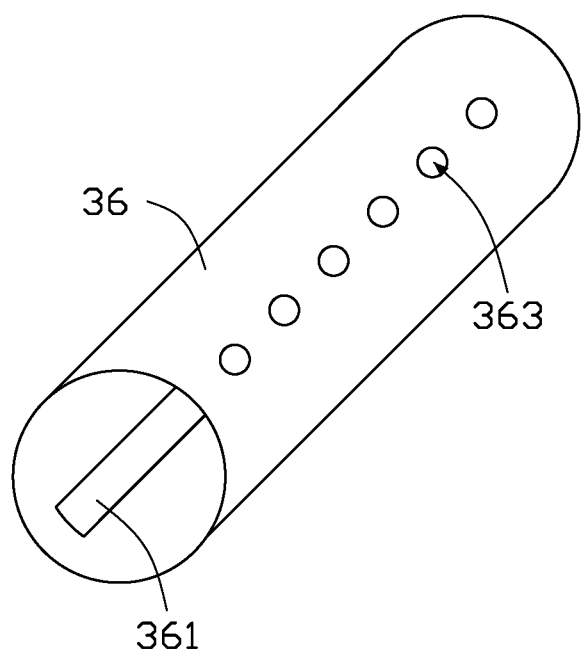
FIG. 7A and FIG. 7B show schematic diagrams of a third conduit of the coolant circulation mechanism.
Figure 7B:
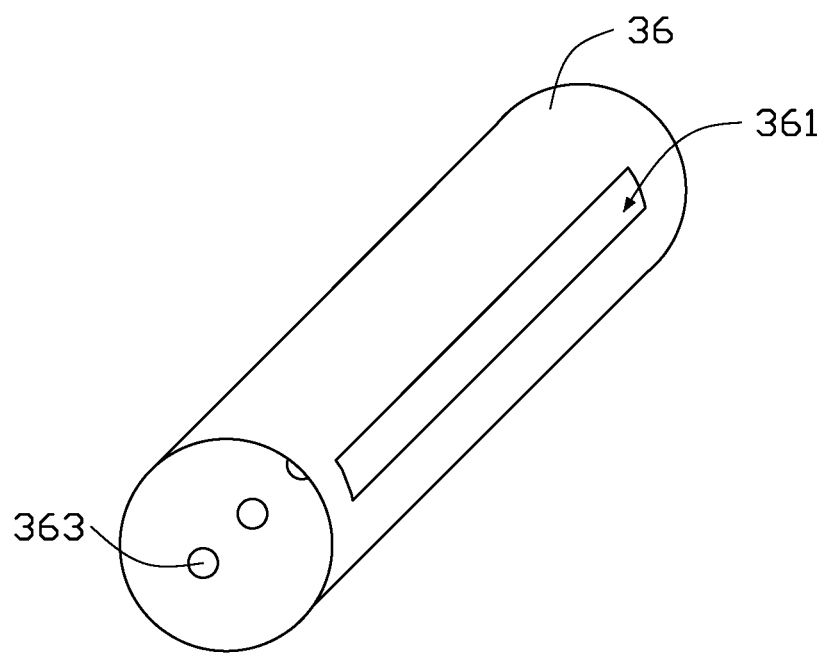
Figure 7C:
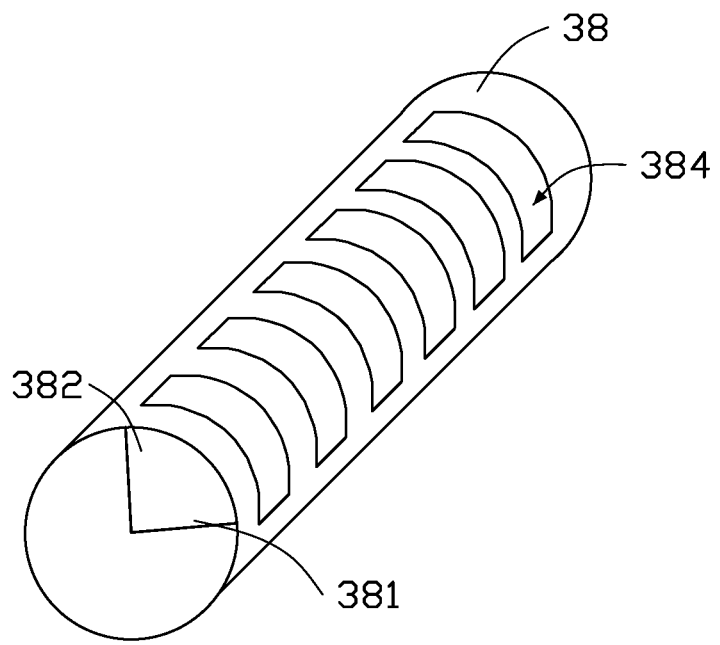
FIG. 7C and FIG. 7D show schematic diagrams of a control conduit of the coolant circulation mechanism.
Figure 7D:
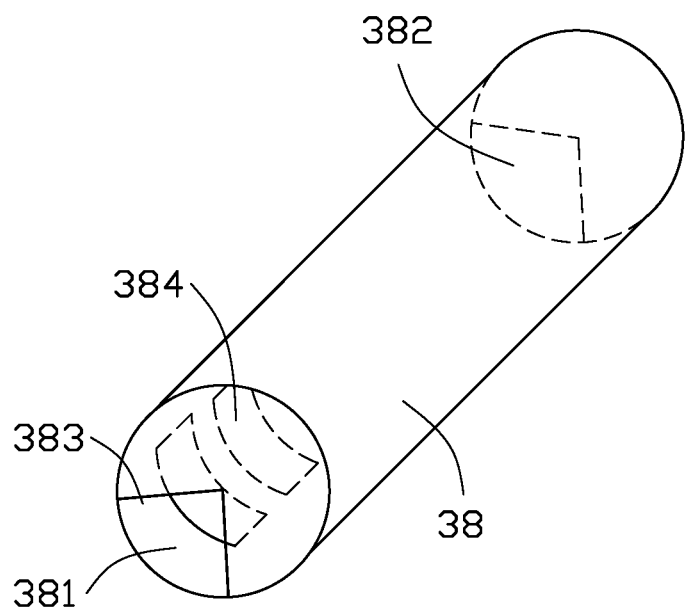
Figure 8A:
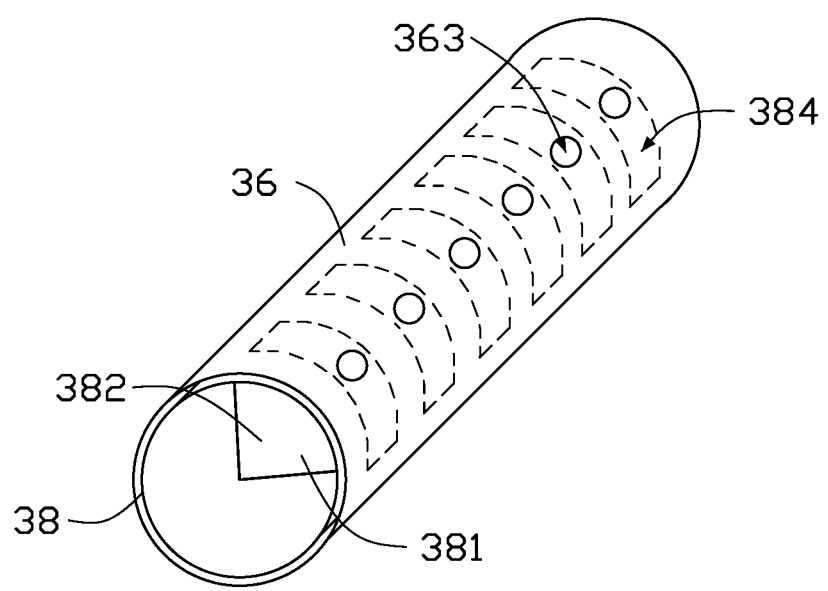
FIG. 8A, FIG. 8B, and FIG. 8C show schematic diagrams of the third conduit and the control conduit.
Figure 8B:
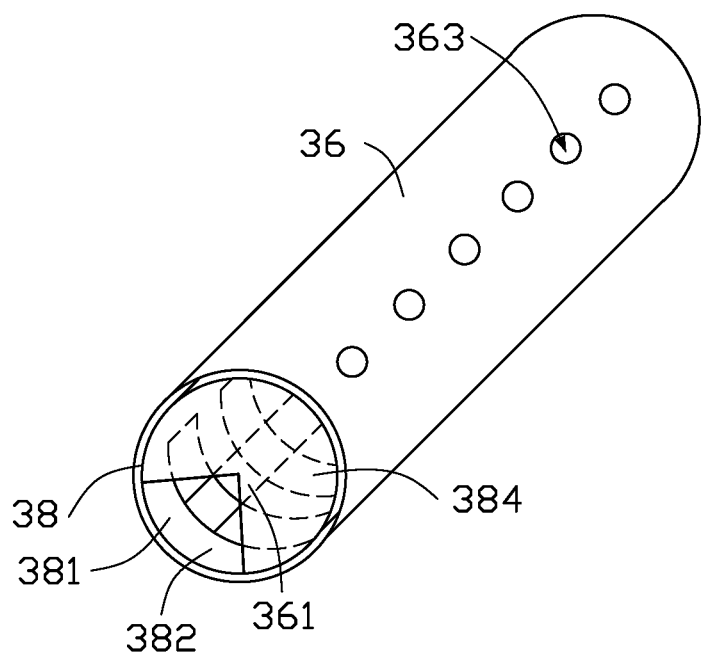
Figure 8C:
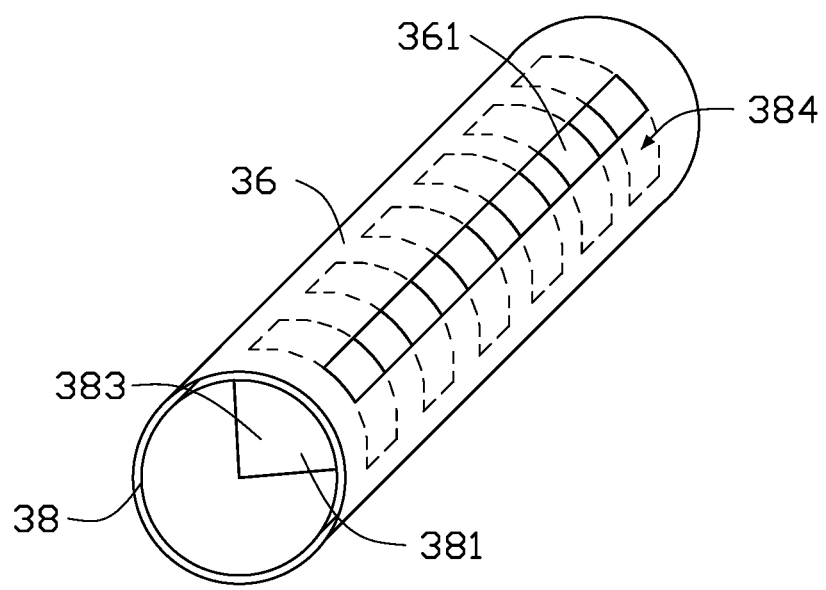

Referring to FIGS. 4-6, the coolant circulation mechanism 30 includes a first conduit 32, a second conduit 34, and at least one control conduit 38. The first conduit 32 and the second conduit 34 are connected to the heat exchange mechanism 50. The at least one control conduit 38 is connected to the cooling chamber 11 and selectively connects to the first conduit 32 or the second conduit 34. Under the action of a heat exchange circulation pump 80 regulating hydraulic pressure, after the control conduit 38 connects to the second conduit 34, the coolant flows from the cooling chamber 11 to the heat exchange mechanism 50 through the second conduit 34. After the control conduit 38 connects to the first conduit 32, the coolant flows into the cooling chamber 11 from the heat exchange mechanism 50 through the first conduit 32. In other embodiments, the heat exchange circulation pump 80 may be omitted.

In one embodiment, a plurality of control conduits 38 is provided, so that each control conduit 38 connects to the watertight space formed by the partition plates 106 to separately fill/recover the coolant. In other embodiments, a quantity of the control conduits 38 may be one if the partition plates 106 are omitted.

Specifically, the first conduit 32 and the second conduit 34 pass through the cabinet 10, such that the first conduit 32 is adjacent to the front plate 103, and the second conduit 34 is adjacent to the rear plate 104.

Referring to FIGS. 5 and 6, at least one inlet port 321 is defined in one side of the first conduit 32 facing the second conduit 34. At least one outlet port 341 is defined in one side of the second conduit 34 facing the first conduit 32. An orthographic projection of the at least one inlet port 321 on a plane of the at least one outlet port 341 does not overlap with the outlet port 341.

Two ends of each of the control conduits 38 are respectively rotationally connected to the first conduit 32 and the second conduit 34 and respectively cover a corresponding inlet port 321 and a corresponding outlet port 341. Each control conduit 38 defines a communication passage 381 extending through both ends thereof. The communication passage 381 forms a first communication port 382 and a second communication port 383 at two ends of the control conduit 38, respectively. At least one third communication port 384 (shown in FIGS. 7C, 7D, 8A, and 8B) is formed on a peripheral wall of the control conduit 38 to communicate with the cooling chamber 11. An orthographic projection of the first communication port 382 on a plane of the second communication port 383 overlaps with the second communication port 383. When the first communication port 382 is in communication with the inlet port 321, the second communication port 383 is offset from the outlet port 341, and an end surface of the control conduit 38 closes the outlet port 341. When the second communication port 383 is in communication with the outlet port 341, the first communication port 382 is offset from the inlet port 321, and an end surface of the control conduit 38 closes the inlet port 321. The third communication port 384 communicates with the cooling chamber 11 to allow the coolant to flow into or flow out of the cooling chamber 11.

In one embodiment, the control conduit 38 can be rotated to offset the first communication port 382 from the inlet port 321 while the second communication port 383 is offset from the outlet port 341 to stop a flow of the coolant.

In other embodiments, the orthographic projection of the inlet port 321 on a plane of the outlet port 341 overlaps with the outlet port 341, and an orthographic projection of the first communication port 382 on a plane of the second communication port 383 is does not overlap with the second communication port 383. Thus, the control conduit 38 is rotated to make the first communication port 382 and the second communication port 383 communicate with the inlet port 321 or the outlet port 341.

In one embodiment, the inlet port 321 and the outlet port 341 are quarter-circular shaped, and the orthographic projection of the inlet port 321 on the plane of the outlet port 341 is symmetrical to the outlet port 341. A shape of the first communication port 382 and the second communication port 383 matches the shape of the inlet port 321 and the outlet port 341. In other embodiments, the inlet port 321, the outlet port 341, the first communication port 382, and the second communication port 383 may be other shapes as long as the control conduit 38 can be rotated to selectively connect to the first conduit 32 or the second conduit 34.

Referring to FIGS. 7A-8C, in one embodiment, the coolant circulation mechanism 30 further includes a third conduit 36. The third conduit 36 is sleeved on the control conduit 38, and two ends of the third conduit 36 are fixedly connected to the first conduit 32 and the second conduit 34, respectively. At least one first conducting hole 361 and at least one second conducting hole 363 are formed in a peripheral wall of the third conduit 36. A total size of the at least one first conducting hole 361 is larger than a total size of the at least one second conducting hole 363. When the control conduit 38 rotates to make the first communication port 382 communicate with the inlet port 321, the third communication port 384 communicates with the at least one second conducting hole 363, so that the coolant flows into the cooling chamber 11. When the control conduit 38 rotates to make the second communication port 383 communicate with the outlet port 341, the third communication port 384 communicates with the at least one first conducting hole 361, so that the coolant flows out of the cooling chamber 11. Thus, the cooling chamber 11 communicates with the first through hole 361 having a larger size to quickly recover the coolant, and the cooling chamber 11 communicates with the second conducting hole 363 having a smaller size to control a flow amount of the coolant when the coolant is filled in.

In other embodiments, the third conduit 36 may be omitted if it is not required to set a different flow rate for recovering or filling the coolant.

Referring to FIGS. 4 and 9, the coolant circulation mechanism 30 further includes a circulation conduit 31. Each branch of the circulation conduit 31 is connected to the cooling chamber 11 and the heat exchange mechanism 50 and corresponds to a corresponding control conduit 38. The circulation conduit 31 is connected to one side of the cabinet 10 adjacent to the top plate 102 and located between the plurality of cable holes 13 and the bottom plate 101. When a level of the coolant reaches the circulation conduit 31, the coolant flows through the circulation conduit 31 to the heat exchange mechanism 50. When the cooling device 100 is in normal operation, the coolant flows into the cooling chamber 11 through the at least one second conducting hole 363 of the first conduit 32, and the coolant flows through the circulating conduit 31 to the heat exchange mechanism 50 to realize circulation of the coolant.

Referring to FIG. 9, in one embodiment, the cooling device 100 further includes a supplementing conduit 33. The supplementing conduit 33 is connected to the cooling chamber 11. The supplementing conduit 33 is connected to a coolant filter (not shown) and adjusts a circulation amount of the coolant in the cooling chamber 11 when the cooling device 100 is in normal operation. The supplementing conduit 33 can also fill the coolant into the cooling device 100 from a coolant storage tank (not shown) when the cooling device 100 is initially operated or when the coolant needs to be replenished. The supplementing conduit 33 recovers the coolant from the cooling chamber 11 into the coolant storage tank during maintenance of the cabinet 10.

Referring to FIG. 9, in one embodiment, the cooling device 100 further includes at least one sensor 35. The sensor 35 is used for sensing a temperature of the coolant and a level of the coolant in the cooling chamber 11.

Referring to FIGS. 1 and 9, the cooling mechanism 70 includes a cooling conduit 72, a cooling circulation pump 73, and a fan 74. The cooling conduit 72 partially extends into the heat exchange mechanism 50. The cooling conduit 72 is used for circulating cooling water, and the cooling circulation pump 73 is used for regulating a water pressure of the cooling water. The cooling water performs heat-exchange with the coolant after entering the heat exchange mechanism 50. The fan 74 faces the cooling conduit 72 to dissipate heat.

To install the electronic device 200 in the cooling device 100, the top plate 102 is opened, and at least one partition plate 106 is inserted to form the watertight space for a preset loading position of the electronic device 200. The corresponding control conduit 38 is rotated to make the second communication port 383 communicate with the outlet port 341 to cause the coolant to flow out of the watertight space, and a corresponding valve of the circulation conduit 31 is closed. When the corresponding sensor 35 senses that all of the coolant in the watertight space is recovered, the front plate 103 is opened to install the electronic device 200. After the cables of the electronic device 200 are connected and the electronic device is installed, the front plate 103 is closed, the control conduit 38 is rotated to make the first communication port 382 communicate with the inlet port 321 to cause the coolant to flow into the watertight space, the corresponding valve of the circulation conduit 31 is opened, the at least one partition plate 106 is removed, the top plate 102 is closed, and the electronic device 200 is activated.

When the cooling device 100 is in an operating state, the first communication port 382 is in communication with the inlet port 321, and the circulation conduit 31 circulates the coolant around the heat exchange mechanism 50, the first conduit 32, the control conduit 38, the cooling chamber 11, the circulation conduit 31, and the heat exchange mechanism 50. The coolant that has absorbed heat from the electronic device 200 flows from the circulation conduit 31 to the heat exchange mechanism 50. After the coolant exchanges heat in the heat exchange mechanism 50, the coolant flows into the cooling chamber 11 through the first conduit 32 and the control conduit 38.

To remove the electronic device 200 from the cooling device 100, operation of the electronic device 200 is stopped, the top plate 102 is opened, the cables of the electronic device 200 are removed, and the at least one partition plate 106 is inserted to form the watertight space for the electronic device 200. Then, the corresponding control conduit 38 is rotated to make the second communication port 383 communicate with the outlet port 341 to cause the coolant to flow out of the watertight space, and the corresponding valve of the circulation conduit 31 is closed. When the corresponding sensor 35 senses that the coolant in the watertight space is completely recovered, the front plate 103 is opened to remove the electronic device 200. After the electronic device 200 is removed, the front plate 103 and the top plate 102 are closed. At this time, it is not necessary to fill the coolant into the watertight space between the partition plates 106. Thus, less coolant is required in the cooling device 100.

The coolant flows into the cooling chamber 11 from the heat exchange mechanism 50 through the first conduit 32, and the coolant flows out of the cooling chamber 11 to the heat exchange mechanism 50 through the second conduit 34. The control conduit 38 is rotated to selectively connect to the first conduit 32 or the second conduit 34 to switch between filling the coolant or recovering the coolant. Thus, the cooling device 100 has a simple structure for filling and recovering the coolant.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A cooling device comprising:
   a cabinet defining a cooling chamber for receiving an electronic device;
   a coolant circulation mechanism; and
   a heat exchange mechanism; wherein:
   the coolant circulation mechanism comprises a first conduit, a second conduit, a control conduit, and a circulation conduit;
   the circulation conduit is connected to the cabinet and the heat exchange mechanism;
   the first conduit and the second conduit are connected to the heat exchange mechanism;
   the control conduit is connected to the cooling chamber and selectively connects to the first conduit or the second conduit;
   when the control conduit connects to the second conduit, coolant from the cooling chamber flows to the heat exchange mechanism through the second conduit;
   when the control conduit connects to the first conduit, the coolant from the heat exchange mechanism flows to the cooling chamber through the first conduit; and
   the coolant in the cooling chamber flows through the circulation conduit to the heat exchange mechanism when a level of the coolant in the cooling chamber reaches the circulation conduit.

2. The cooling device of claim 1, wherein:
   a side of the first conduit facing the second conduit defines at least one inlet port;

a side of the second conduit facing the first conduit defines at least one output port;
two ends of the control conduit are respectively rotationally coupled to the first conduit and the second conduit to cover the inlet port or the outlet port;
the control conduit defines a communication passage passing through the two ends of the control conduit;
the communication passage respectively forms a first communication port and a second communication port in the two ends of the control conduit;
a third communication port is formed on a peripheral wall of the control conduit and communicates with the cooling chamber;
when the control conduit is rotated to make the first communication port communicate with the inlet port, the second communication port is offset from the outlet port, and an end surface of the control conduit closes the outlet port;
when the control conduit is rotated to make the second communication port communicate with the outlet port, the first communication port is offset from the inlet port, and an end surface of the control conduit closes the inlet port.

3. The cooling device of claim 2, wherein:
the inlet port and the outlet port are quarter-circular shaped;
an orthographic projection of the inlet port on a plane of the outlet port is symmetrical to the outlet port; and
a shape of the first communication port and a shape of the second communication port match a shape of the inlet port and a shape of the outlet port.

4. The cooling device of claim 2, wherein:
the coolant circulation mechanism further comprises a third conduit sleeved on the control conduit;
two ends of the third conduit are fixedly connected to the first conduit and the second conduit, respectively;
at least one first conducting hole and at least one second conducting hole are formed in a peripheral wall of the third conduit;
a total size of the at least one first conducting hole is larger than a total size of the at least one second conducting hole;
when the control conduit rotates to make the first communication port communicate with the inlet port, the third communication port communicates with the at least one second conducting hole;
when the control conduit rotates to make the second communication port communicate with the outlet port, the third communication port communicates with the at least one first conducting hole.

5. The cooling device of claim 1, wherein:
the cabinet comprises a bottom plate, a top plate, a front plate, a rear plate, and two side plates;
the bottom plate is located facing the top plate;
the front plate is located facing the rear plate;
the front plate and the rear plate are located between the bottom plate and the top plate;
the two side plates face each other and are located between the bottom plate and the top plate; and
the bottom plate, the top plate, the front plate, the rear plate, and the two side plates cooperatively define a cooling chamber.

6. The cooling device of claim 5, wherein:
the cabinet further comprises at least one partition plate;
the at least one partition plate is inserted into the cooling chamber and abuts the bottom plate, the front plate, and the rear plate to form a watertight space;
a quantity of the control conduit is a plurality; and
at least one corresponding control conduit is connected to the watertight space, and the coolant flows into and out of the watertight space through the corresponding control conduit.

7. The cooling device of claim 6, wherein:
the front plate includes a plurality of first plate segments; and
each of the first plate segments is configured to be individually opened or closed.

8. The cooling device of claim 5, wherein:
the bottom plate comprises four extending plates;
the four extending plates are located outside the front plate, the rear plate, and the two side plates, respectively;
each of the extending plates defines a plurality of drainage holes; and
the extending plates receive the coolant leaked out of the cooling chamber through the drainage holes.

9. The cooling device of claim 5, wherein:
the top plate comprises a plurality of second plate segments; and
the second plate segments are adapted for sliding in a plane in a first direction or a second direction perpendicular to the first direction.

10. The cooling device of claim 1, further comprising a cooling mechanism, wherein:
the cooling mechanism comprises a cooling conduit, a cooling circulation pump, and a fan;
the cooling conduit partially extends into the heat exchange mechanism;
the cooling conduit is configured for circulating cooling water, and the cooling circulation pump is configured for regulating a water pressure of the cooling water;
the heat exchange mechanism is adapted for heat-exchanging between the cooling water and the coolant; and
the fan faces the cooling conduit to dissipate heat.

11. A cooling device comprising:
a cabinet defining a cooling chamber for receiving an electronic device;
a coolant circulation mechanism; and
a heat exchange mechanism; wherein:
the coolant circulation mechanism comprises a first conduit, a second conduit, and a plurality of control conduits;
the first conduit, the second conduit, and the plurality of control conduits are located within the cooling chamber;
the first conduit and the second conduit are connected to the heat exchange mechanism;
each of the plurality of control conduits located in the cooling chamber is selectively connected to the first conduit or the second conduit;
when the control conduit connects to the second conduit, coolant from the cooling chamber flows to the heat exchange mechanism through the second conduit; and
when the control conduit connects to the first conduit, the coolant from the heat exchange mechanism flows to the cooling chamber through the first conduit.

12. The cooling device of claim 11, wherein:
the coolant circulation mechanism further comprises a circulation conduit;
the circulation conduit is connected to the cabinet and the heat exchange mechanism; and
the coolant in the cooling chamber flows through the circulation conduit to the heat exchange mechanism when a level of the coolant in the cooling chamber reaches the circulation conduit.

13. The cooling device of claim 12, wherein:
a side of the first conduit facing the second conduit defines at least one inlet port;
a side of the second conduit facing the first conduit defines at least one output port;
two ends of the control conduit are respectively rotationally coupled to the first conduit and the second conduit to cover the inlet port or the outlet port;
the control conduit defines a communication passage passing through the two ends of the control conduit;
the communication passage respectively forms a first communication port and a second communication port in the two ends of the control conduit;
a third communication port is formed on a peripheral wall of the control conduit and communicates with the cooling chamber;
when the control conduit is rotated to make the first communication port communicate with the inlet port, the second communication port is offset from the outlet port, and an end surface of the control conduit closes the outlet port;
when the control conduit is rotated to make the second communication port communicate with the outlet port, the first communication port is offset from the inlet port, and an end surface of the control conduit closes the inlet port.

14. The cooling device of claim 13, wherein:
the coolant circulation mechanism further comprises a third conduit sleeved on the control conduit;
two ends of the third conduit are fixedly connected to the first conduit and the second conduit;
at least one first conducting hole and at least one second conducting hole are formed in a peripheral wall of the third conduit;
a total size of the at least one first conducting hole is larger than a total size of the at least one second conducting hole;
when the control conduit rotates to make the first communication port communicate with the inlet port, the third communication port communicates with the at least one second conducting hole;
when the control conduit rotates to make the second communication port communicate with the outlet port, the third communication port communicates with the at least one first conducting hole.

15. The cooling device of claim 14, wherein:
the cabinet comprises a bottom plate, a top plate, a front plate, a rear plate, and two side plates;
the bottom plate is located facing the top plate;
the front plate is located facing the rear plate;
the front plate and the rear plate are located between the bottom plate and the top plate;
the two side plates face each other and are located between the bottom plate and the top plate; and
the bottom plate, the top plate, the front plate, the rear plate, and the two side plates cooperatively define a cooling chamber.

16. The cooling device of claim 15, wherein:
the cabinet further comprises at least one partition plate;
the at least one partition plate is inserted into the cooling chamber and abuts the bottom plate, the front plate, and the rear plate to form a watertight space;
each of the plurality of control conduits is connected to a corresponding watertight space; and
the coolant flows into and out of the watertight space through the corresponding control conduit.

17. The cooling device of claim 16, wherein:
the front plate includes a plurality of first plate segments; and
each of the plurality of first plate segments is configured to be individually opened or closed to open or close a corresponding watertight space.

18. The cooling device of claim 17, wherein:
the bottom plate comprises four extending plates;
the four extending plates are located outside the front plate, the rear plate, and the two side plates, respectively;
each of the extending plates defines a plurality of drainage holes; and
the extending plates receives the coolant leaked out of the cooling chamber through the drainage holes.

19. The cooling device of claim 18, wherein:
the top plate comprises a plurality of second plate segments; and
the second plate segments are adapted for sliding in a plane in a first direction or a second direction perpendicular to the first direction.

20. The cooling device of claim 19, wherein:
the top plate comprises a plurality of second plate segments; and
the second plate segments are adapted for sliding in a plane in a first direction or a second direction perpendicular to the first direction.

* * * * *